(12) United States Patent
Hoffmann et al.

(10) Patent No.: US 9,812,369 B2
(45) Date of Patent: Nov. 7, 2017

(54) BIMOS DEVICE WITH A FULLY SELF-ALIGNED EMITTER-SILICON AND METHOD FOR MANUFACTURING THE SAME

(71) Applicant: Infineon Technologies AG, Neubiberg (DE)

(72) Inventors: Frank Hoffmann, Freiberg (DE); Dirk Manger, Dresden (DE); Andreas Pribil, Dresden (DE); Marc Probst, Radeberg (DE); Stefan Tegen, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/083,774

(22) Filed: Mar. 29, 2016

(65) Prior Publication Data

US 2016/0322257 A1    Nov. 3, 2016

(30) Foreign Application Priority Data

Apr. 30, 2015 (DE) ...................... 10 2015 208 133

(51) Int. Cl.
*H01L 21/8249* (2006.01)
*H01L 27/06* (2006.01)
(Continued)

(52) U.S. Cl.
CPC ...... *H01L 21/8249* (2013.01); *H01L 27/0623* (2013.01); *H01L 29/0649* (2013.01); *H01L 29/0692* (2013.01); *H01L 29/0804* (2013.01); *H01L 29/0817* (2013.01); *H01L 29/0821* (2013.01); *H01L 29/1004* (2013.01); *H01L 29/66242* (2013.01); *H01L 29/66272* (2013.01); *H01L 29/7371* (2013.01)

(58) Field of Classification Search
CPC ............ H01L 21/8249; H01L 27/0623; H01L 29/0649; H01L 29/0692; H01L 29/1004; H01L 29/0804; H01L 29/0821
See application file for complete search history.

(56) References Cited

U.S. PATENT DOCUMENTS

2007/0161176 A1* 7/2007 Dahl ................. H01L 29/66242
438/230
2015/0357446 A1* 12/2015 Tschumakow .... H01L 29/66242
257/586

FOREIGN PATENT DOCUMENTS

DE        102004053393        5/2006

* cited by examiner

*Primary Examiner* — Asok K Sarkar
*Assistant Examiner* — Dmitriy Yemelyanov
(74) *Attorney, Agent, or Firm* — Harrity & Harrity, LLP

(57) ABSTRACT

A method comprises providing a substrate of a first conductive type and a layer stack arranged on the substrate. The layer stack comprises a first isolation layer, a sacrificial layer, and a second isolation layer. The layer stack comprises a window formed in the layer stack through the second isolation layer, the sacrificial layer and the first isolation layer up to a surface region of the substrate. The method comprises providing a collector layer. The method comprises providing a base layer on the collector layer within the window of the layer stack. The method comprises providing an emitter layer or an emitter layer stack comprising the emitter layer on the base layer within the window of the layer stack. The method further comprises selectively removing the emitter layer or the emitter layer stack at least up to the second isolation layer.

25 Claims, 16 Drawing Sheets

(51) Int. Cl.
*H01L 29/06* (2006.01)
*H01L 29/08* (2006.01)
*H01L 29/10* (2006.01)
*H01L 29/66* (2006.01)
*H01L 29/737* (2006.01)

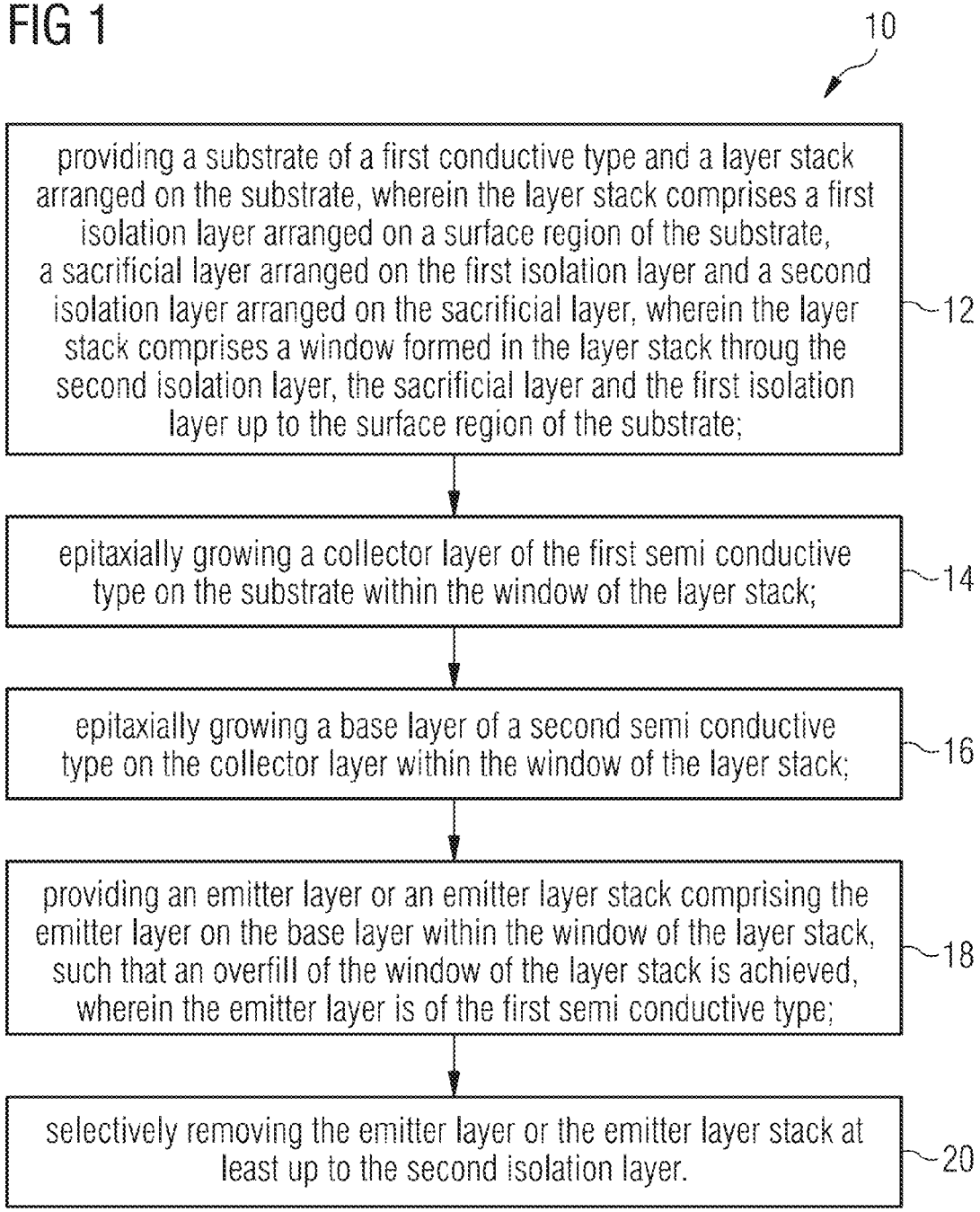

CVD Carbon as masking layer dry etch & wet etch
Damage free strip by O2 plasma after SiO2 pullback Short hot phos or hfeg
Option 1: taper by dilute HF wet etch
Option 2: taper by dry etch SiN hardmask removal:
Top SiN RTCVD SiN (fast etching in HFEG)
Dummy SiN LPCVD (slow etching in HFEG)

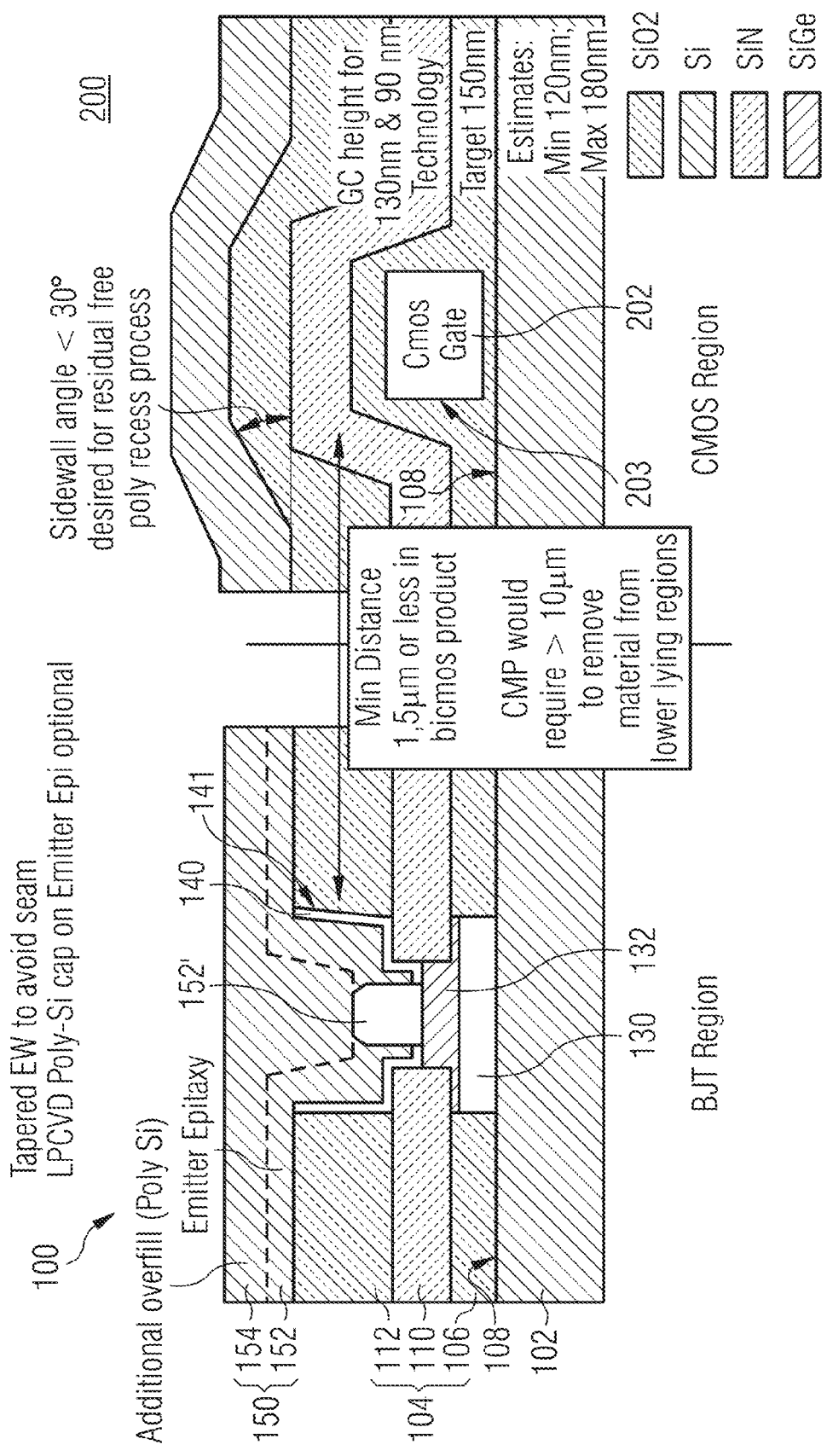

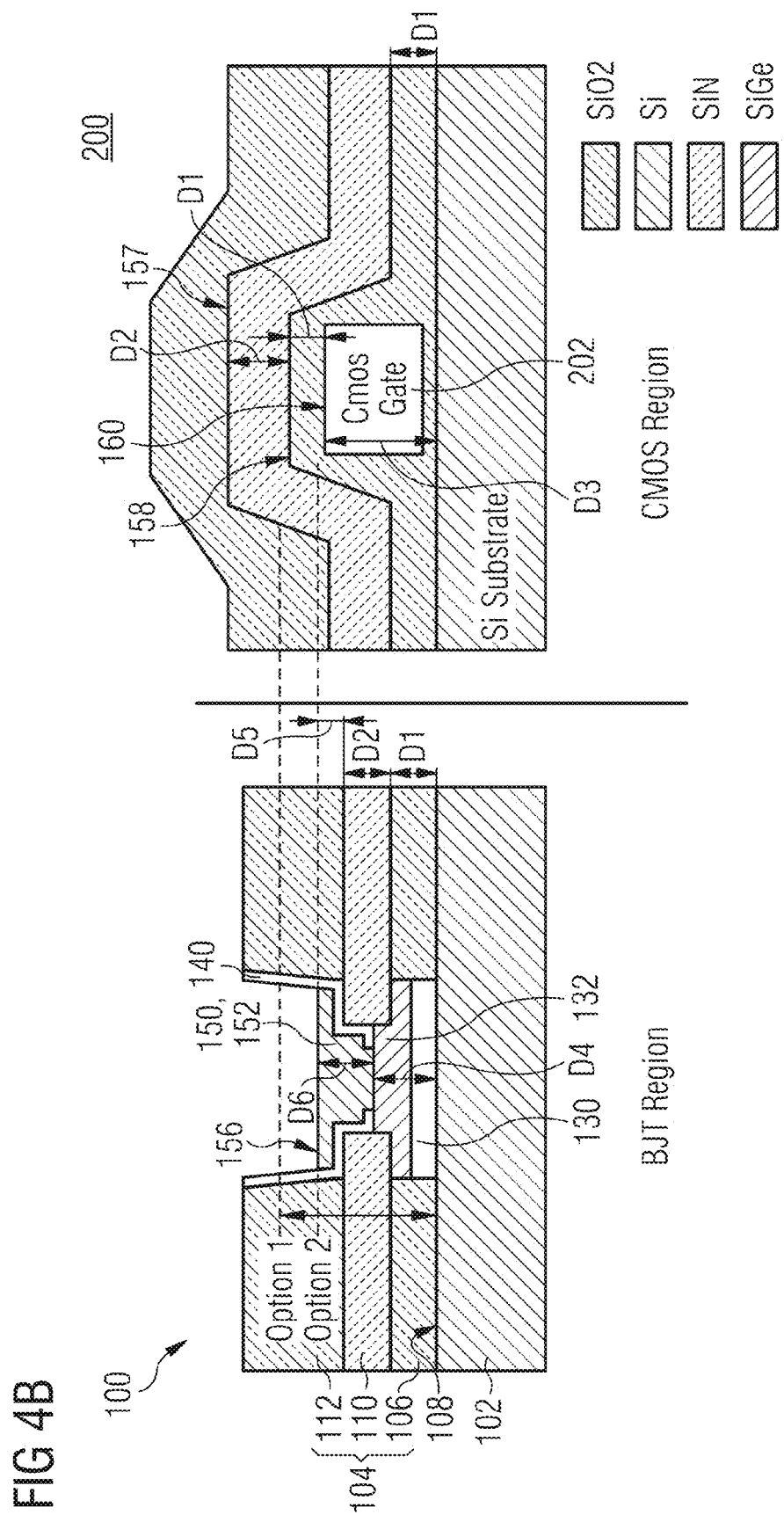

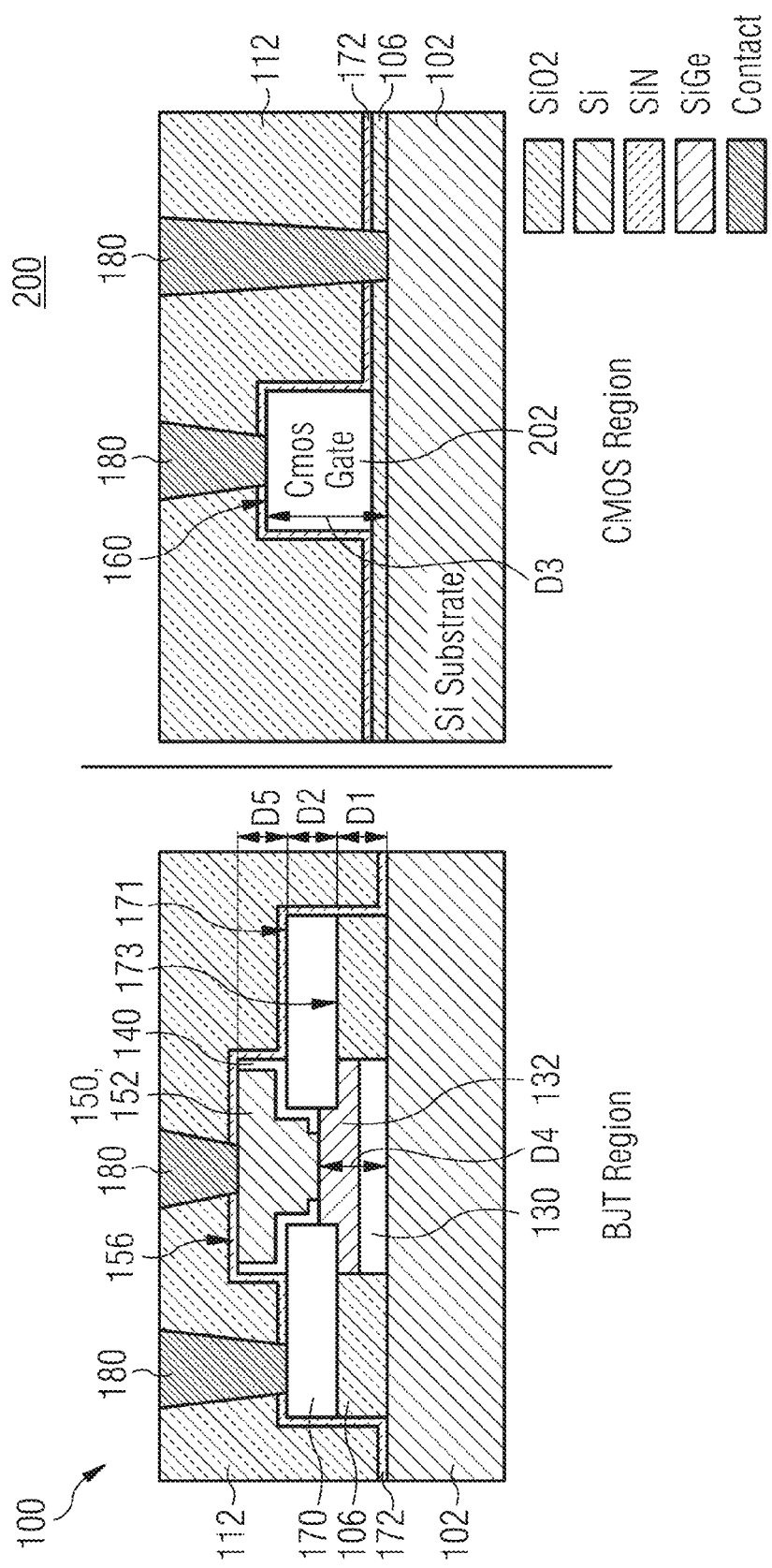

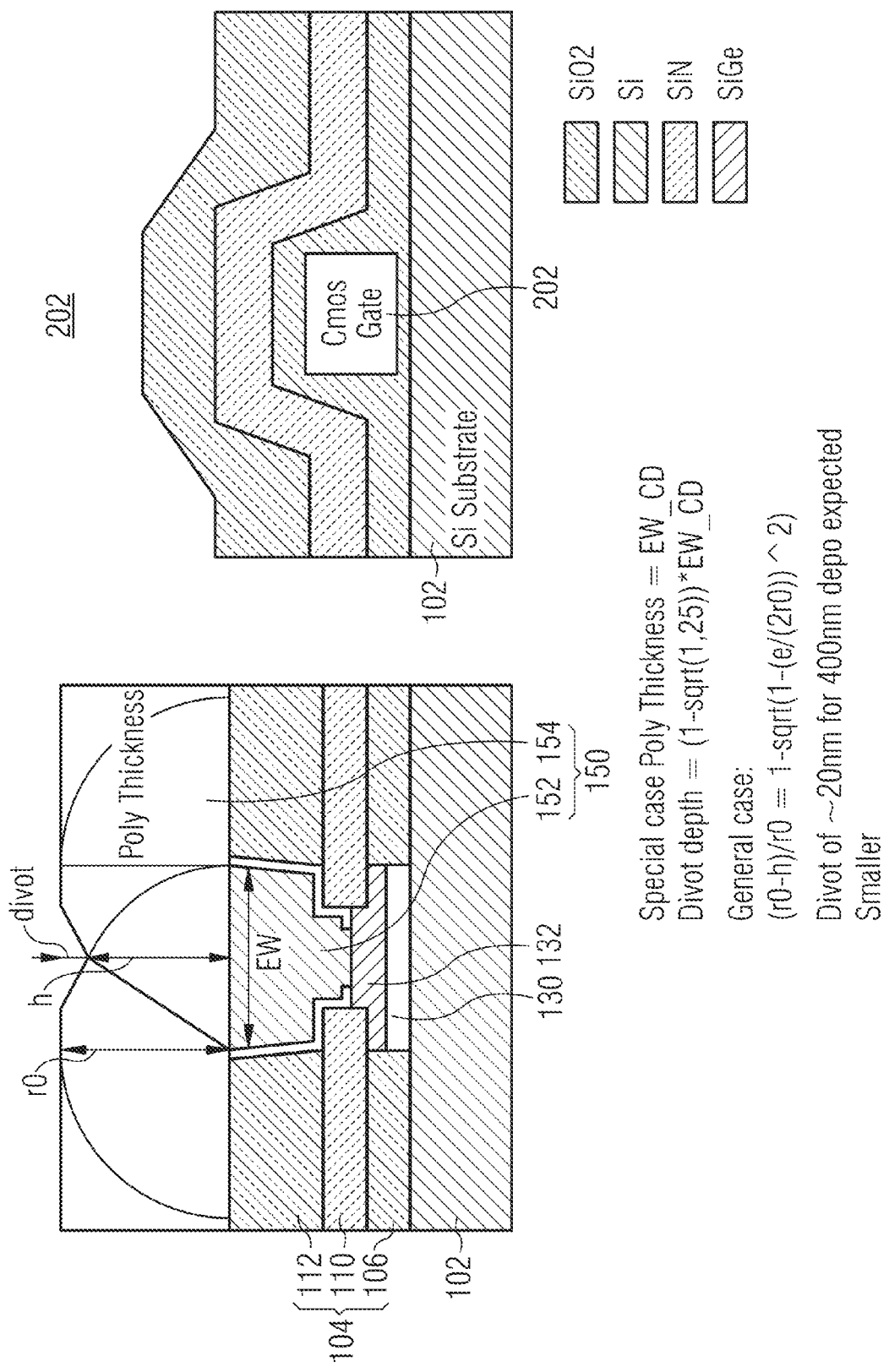

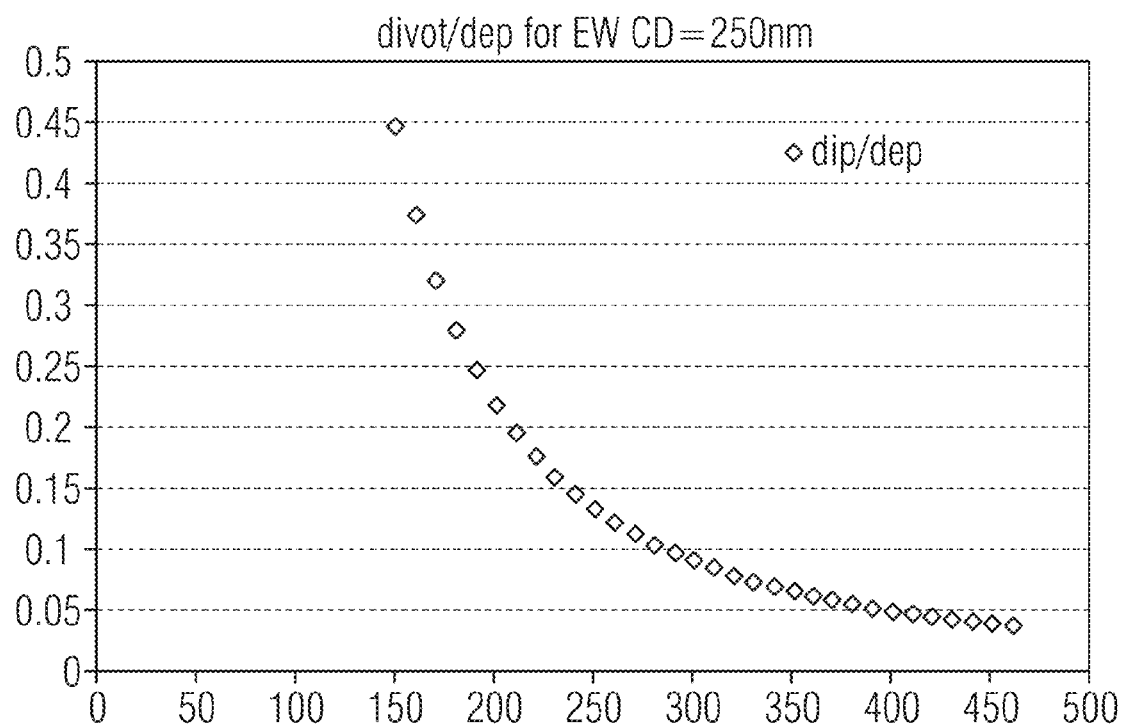

FIG 5C-1

| ew cd (e) | poly thickness(r0) | rel divot depth | abs divot depth | Relation (r0-h)/r0=1-sqrt(1-(e/(2r0)))^2 |
|---|---|---|---|---|
| 220 | 125 | 0.53 | 66 | |
| | 145 | 0.35 | 51 | |
| | 165 | 0.25 | 42 | |
| | 185 | 0.20 | 36 | |
| | 205 | 0.16 | 32 | |
| | 225 | 0.13 | 29 | |
| | 245 | 0.11 | 26 | |
| | 265 | 0.09 | 24 | |
| | 285 | 0.08 | 22 | |
| | 305 | 0.07 | 21 | |
| | 325 | 0.06 | 19 | |
| | 345 | 0.05 | 18 | ← |
| | 365 | 0.05 | 17 | |
| | 385 | 0.04 | 16 | |
| | 405 | 0.04 | 15 | |
| | 425 | 0.03 | 14 | |
| | 445 | 0.03 | 14 | |
| | 465 | 0.03 | 13 | |
| | 485 | 0.03 | 13 | |
| | 505 | 0.02 | 12 | |
| | 525 | 0.02 | 12 | |
| | 545 | 0.02 | 11 | |
| | 565 | 0.02 | 11 | |
| | 585 | 0.02 | 10 | |
| | 605 | 0.02 | 10 | |
| | 625 | 0.02 | 10 | |
| | 645 | 0.01 | 9 | |
| | 665 | 0.01 | 9 | |
| | 685 | 0.01 | 9 | |
| | 705 | 0.01 | 9 | ← |
| | 725 | 0.01 | 8 | |
| | 745 | 0.01 | 8 | |
| | 765 | 0.01 | 8 | |
| | 785 | 0.01 | 8 | |
| | 805 | 0.01 | 8 | |
| | 825 | 0.01 | 7 | |
| | 845 | 0.01 | 7 | |
| | 865 | 0.01 | 7 | |
| | 885 | 0.01 | 7 | |
| | 905 | 0.01 | 7 | |
| | 925 | 0.01 | 7 | |
| | 945 | 0.01 | 6 | |
| | 065 | 0.01 | 6 | |
| | 985 | 0.01 | 6 | |
| | 1005 | 0.01 | 6 | |

Arrows indicate possible target configuration.
All values [nm]

FIG 5C-2

| ew cd (e) | poly thickness(r0) | rel divot depth | abs divot depth | Relation (r0-h)/r0=1-sqrt(1-(e/(2r0))^2) |
|---|---|---|---|---|
| 340 | 125 | | | |
| | 145 | | | |
| | 165 | | | |
| | 185 | 0.61 | 112 | |
| | 205 | 0.44 | 90 | |
| | 225 | 0.34 | 78 | |
| | 245 | 0.28 | 69 | |
| | 265 | 0.23 | 62 | |
| | 285 | 0.20 | 56 | |
| | 305 | 0.17 | 52 | |
| | 325 | 0.15 | 48 | |
| | 345 | 0.13 | 45 | ← |
| | 365 | 0.12 | 42 | |
| | 385 | 0.10 | 40 | |
| | 405 | 0.09 | 37 | |
| | 425 | 0.08 | 35 | |
| | 445 | 0.08 | 34 | |
| | 465 | 0.07 | 32 | |
| | 485 | 0.06 | 31 | |
| | 505 | 0.06 | 29 | |
| | 525 | 0.05 | 28 | |
| | 545 | 0.05 | 27 | |
| | 565 | 0.05 | 26 | |
| | 585 | 0.04 | 25 | |
| | 605 | 0.04 | 24 | |
| | 625 | 0.04 | 24 | |
| | 645 | 0.04 | 23 | |
| | 665 | 0.03 | 22 | |
| | 685 | 0.03 | 21 | |
| | 705 | 0.03 | 21 | ← |
| | 725 | 0.03 | 20 | |
| | 745 | 0.03 | 20 | |
| | 765 | 0.03 | 19 | |
| | 785 | 0.02 | 19 | |
| | 805 | 0.02 | 18 | |
| | 825 | 0.02 | 18 | |
| | 845 | 0.02 | 17 | |
| | 865 | 0.02 | 17 | |
| | 885 | 0.02 | 16 | |
| | 905 | 0.02 | 16 | |
| | 925 | 0.02 | 16 | |
| | 945 | 0.02 | 15 | |
| | 065 | 0.02 | 15 | |
| | 985 | 0.02 | 15 | |
| | 1005 | 0.01 | 14 | |

Arrows indicate possible target configuration.
All values [nm]

New Dielectric Stack
(LPCVD&HDP SiO2/LPSiN/HDP SiO2)

Profile achieved by HDP 2x SiO2
(sidewall: angle < 10°)

300 nm

ST-00778_ZA435710.21_center_PC 11B02PACM1BF00 100000x 10 kV

Example for Stepcoverage conventional depositions on CMOS gate topography >
(this is not target stack, different technology)
LPCVD SiO2, PolySi, SiN from bottom to top 47 nm
189 nm Profile by pe / lpcvd sio2
(sidewall angle > 80°)

BIMOS DEVICE WITH A FULLY SELF-ALIGNED EMITTER-SILICON AND METHOD FOR MANUFACTURING THE SAME

RELATED APPLICATION

This application claims priority under 35 U.S.C. §119 to German Patent Application No. 102015208133.8, filed on Apr. 30, 2015, the content of which is incorporated by reference herein in its entirety.

TECHNICAL FIELD

Embodiments relate to a method for manufacturing a bipolar junction transistor. Further embodiments relate to a method for manufacturing a BiMOS device (BiMOS is a semiconductor technology that integrates a bipolar junction transistor and a MOS device (MOS=metal-oxide-semiconductor) in one single integrated circuit device). Further embodiments relate to a BiMOS device. Some embodiments relate to a BiCMOS structure featuring a fully self-aligned emitter-silicon with advantageous vertical dimensions (BiCMOS is a semiconductor technology that integrates a bipolar junction transistor and a CMOS transistor (CMOS=complementary metal-oxide-semiconductor) in one single integrated circuit device).

BACKGROUND

In a common BiCMOS architecture in which the emitter is manufactured in a self-aligned way relative to the collector and the base, the emitter silicon is patterned by means of a damascene process. However, this process flow inevitably results in the upper edge of the emitter silicon to be located above the upper edge of the CMOS gate. Due to the longer feed line length, this result in an increase in the emitter resistance, which has a negative impact on the switching frequency of the bipolar device.

Up to now, the emitter is patterned by a poly-CMP process (CMP=chemical mechanical polishing) with a stop on the GC topography (GC=Gate Conductor). This results in pattern breaking at the wafer edge and in a strong dependence of the emitter height on the specific layout (occupancy density, surroundings) of more than ±30 nm among various layouts.

Therefore, it would be desirable to have a concept for manufacturing a BiMOS device that allows adjusting an height of an emitter of a bipolar junction transistor of the BiMOS device (substantially) independent on a height of a gate of a MOS device of the BiMOS device.

SUMMARY

Embodiments provide a method for manufacturing a bipolar junction transistor. The method comprises providing a substrate of a first conductive type and a layer stack arranged on the substrate, wherein the layer stack comprises a first isolation layer arranged on a surface region of the substrate, a sacrificial layer arranged on the first isolation layer and a second isolation layer arranged on the sacrificial layer, wherein the layer stack comprises a window formed in the layer stack through the second isolation layer, the sacrificial layer and the first isolation layer up to the surface region of the substrate. The method further comprises providing a collector layer of the first semi conductive type on the substrate within the window of the layer stack. The method further comprises providing a base layer of a second semi conductive type on the collector layer within the window of the layer stack. The method further comprises providing an emitter layer or an emitter layer stack comprising the emitter layer on the base layer within the window of the layer stack, such that an overfill of the window of the layer stack is achieved, wherein the emitter layer is of the first semi conductive type. The method further comprises selectively removing the emitter layer or the emitter layer stack at least up to the second isolation layer.

Further embodiments provide a method for manufacturing a BiMOS device, i.e. a bipolar junction transistor and a MOS device on the same substrate. The method comprises providing a substrate of a first conductive type. The method further comprises providing a MOS device on a surface region of the substrate. The method further comprises providing a layer stack, wherein the layer stack is arranged on the surface region of the substrate and in a MOS region on the MOS device, wherein the layer stack comprises a first isolation layer arranged on the surface region of the substrate and in the MOS region on the MOS device, a sacrificial layer arranged on the first isolation layer and a second isolation layer arranged on the sacrificial layer, wherein the layer stack comprises in a bipolar region, different from the MOS region, a window formed in the layer stack through the second isolation layer, the sacrificial layer and the first isolation layer up to the surface region of the substrate. The method further comprises providing a collector layer of the first semi conductive type on the substrate within the window of the layer stack. The method further comprises providing a base layer of a second semi conductive type on the collector layer within the window of the layer stack. The method further comprises providing an emitter layer or an emitter layer stack comprising the emitter layer on the base layer within the window of the layer stack, such that an overfill of the window of the layer stack is achieved and such that the emitter layer or emitter layer stack is arranged on the second isolation area also in the MOS region, wherein the emitter layer is of the first semi conductive type. The method further comprises selectively removing the emitter layer or the emitter layer stack at least up to the second isolation layer in the bipolar region and the MOS region.

Further embodiments provide a BiMOS device. The BiMOS device comprises a substrate of a first conductive type, a MOS device arranged on a surface region of the substrate in a MOS region, and a layer stack arranged on the surface region of the substrate and on the MOS device in the MOS region. The layer stack comprises a first isolation layer arranged on the surface region of the substrate and in the MOS region on the MOS device, a sacrificial layer arranged on the first isolation layer and a second isolation layer arranged on the sacrificial layer. Further, the layer stack comprises in a bipolar region, different from the MOS region, a window formed in the layer stack through the second isolation layer, the sacrificial layer and the first isolation layer up to the surface region of the substrate. Further, the BiMOS device comprises a bipolar junction transistor arranged on the surface region of the substrate in the bipolar region, wherein the bipolar junction transistor comprises a collector layer of the first semi conductive type arranged on the substrate within the window of the layer stack, a base layer of a second semi conductive type arranged on the collector layer within the window of the layer stack, and an emitter layer or an emitter layer stack comprising the emitter layer arranged on the base layer within the window of the layer stack, wherein the emitter layer is of the first semi conductive type. Thereby, a distance between the surface region of the substrate and an upper region of the emitter layer or emitter layer stack of the bipolar junction transistor is smaller than a distance between the surface region of the substrate and an upper surface region of the sacrificial layer in the MOS region.

BRIEF DESCRIPTION OF THE DRAWINGS

Embodiments of the present invention are described herein making reference to the appended drawings.

FIG. 1 shows a flowchart of a method for manufacturing a bipolar junction transistor according to an embodiment;

FIG. 4a shows a schematic cross-sectional view of a BiMOS device before selectively removing the emitter layer or the emitter layer stack at least up to the second isolation layer in the bipolar region and in the MOS region, according to an embodiment;

FIG. 4b shows a schematic cross-sectional view of the BiMOS device after selectively removing the emitter layer or the emitter layer stack at least up to the second isolation layer in the bipolar region and in the MOS region, according to an embodiment;

FIG. 4c shows a schematic cross-sectional view of a final BiMOS device according to an embodiment;

FIG. 5a shows a schematic cross-sectional view of the BiMOS device after providing the emitter layer stack comprising the emitter layer on the base layer within the window of the layer stack, such that an overfill of the window of the layer stack is achieved and such that the emitter layer stack is arranged on the second isolation layer also in the MOS region, according to an embodiment;

FIG. 5b shows in a diagram the ratio of the resulting divot from a conformal deposition to the deposition thickness (divot/dep) for an emitter width of 250 nm;

FIG. 5c shows in a table a divot depth (relative divot depth and absolute divot depth) as a function of a deposited silicon thickness and emitter width;

Figure 2A:
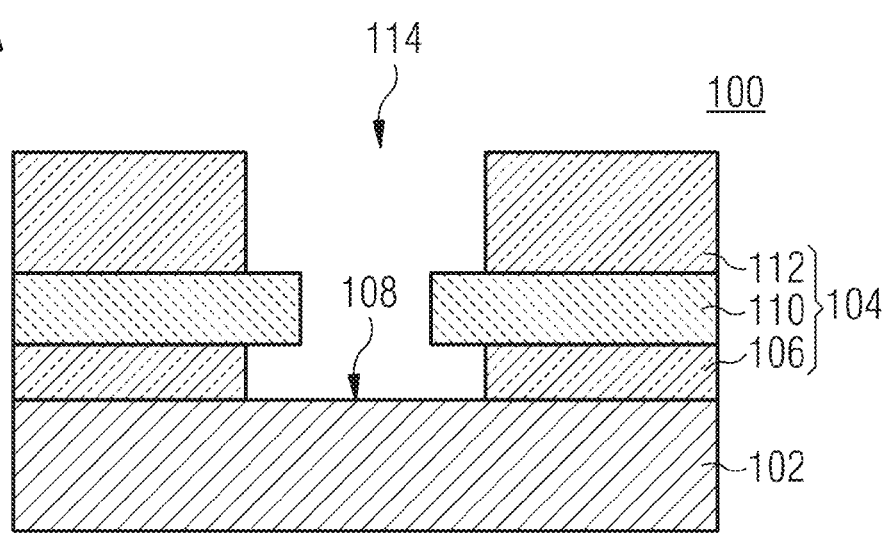
FIG. 2a shows a schematic cross-sectional view of the bipolar junction transistor after providing a substrate and a layer stack arranged on the substrate according to an embodiment.

Equal or equivalent elements or elements with equal or equivalent functionality are denoted in the following description by equal or equivalent reference numerals.

DETAILED DESCRIPTION OF THE INVENTION

FIG. 1 shows a flowchart of a method 10 for manufacturing a bipolar junction transistor (BJT). The method comprises a step 12 of providing a substrate of a first conductive type and a layer stack arranged on the substrate, wherein the layer stack comprises a first isolation layer arranged on a surface region of the substrate, a sacrificial layer arranged on the first isolation layer and a second isolation layer arranged on the sacrificial layer, wherein the layer stack comprises a window formed in the layer stack through the second isolation layer, the sacrificial layer and the first isolation layer up to the surface region of the substrate. The method further comprises a step 14 of providing a collector layer of the first semi conductive type on the substrate within the window of the layer stack. The method further comprises a step 16 of providing a base layer of a second semi conductive type on the collector layer within the window of the layer stack. The method further comprises a step 18 of providing an emitter layer or an emitter layer stack comprising the emitter layer on the base layer within the window of the layer stack, such that an overfill of the window of the layer stack is achieved, wherein the emitter layer is of the first semi conductive type. The method further comprises a step 20 of selectively removing the emitter layer or the emitter layer stack at least up to the second isolation layer.

In the following, the method 10 for manufacturing the bipolar junction transistor is described in detail with respect to FIGS. 2a to 2h, which show schematic cross-sectional views of the bipolar junction transistor after different steps of the method 10 for manufacturing the bipolar junction transistor.

FIG. 2a shows a schematic cross-sectional view of the bipolar junction transistor 100 after providing a substrate 102 and a layer stack 104 arranged on the substrate 102. The substrate 102 can be of the first conductive type. The layer stack 104 can comprise a first isolation layer 106 arranged on a surface region 108 of the substrate 102, a sacrificial layer 110 arranged on the first isolation layer 106 and a second isolation layer 112 arranged on the sacrificial layer 110. The layer stack 104 can comprise a window 114 formed in the layer stack 104 through the second isolation layer 112, the sacrificial layer 110 and the first isolation layer 106 up to the surface region 108 of the substrate 102.

Observe that the expression "arranged on" as used herein may refer to that a first layer (e.g. the first isolation layer 106) is arranged directly on a second layer (e.g. the substrate 102), i.e. without a third layer between the first layer and the second layer. However, the expression "arranged on" as used herein may also refer to that a third layer is arranged between the first layer (e.g. the first isolation layer 106) and the second layer (e.g. the substrate 102).

At least one out of the first isolation layer 106 and the second isolation layer 112 can comprise a relative permittivity of less than 9. According to an exemplary implementation, at least one out of the first isolation layer 106 and the second isolation layer 112 can comprise a relative permittivity of less than 7. The relative permittivity of the first isolation layer 106 and/or the second isolation layer 112 might be chosen to less than 7 when the sacrificial layer is a SiN (silicon nitride) layer. Further, at least one out of the first isolation layer 106 and the second isolation layer 112 can comprise a relative permittivity of less than 4.5. For example, at least one out of the first isolation layer 106 and the second isolation layer 112 can be a $SiO_2$ (silicon dioxide) layer which comprises a relative permittivity of 4.3.

Thus, as indicated in FIG. 2a, the first isolation layer can be a first $SiO_2$ layer, wherein the second isolation layer can be a second $SiO_2$ layer. Thereby, at least one out of the first isolation layer 106 and the second isolation layer 112 can be a HDP SiO2 layer (HDP=high density plasma), i.e. a SiO2 layer manufactured using a high density plasma process.

Figure 2B:
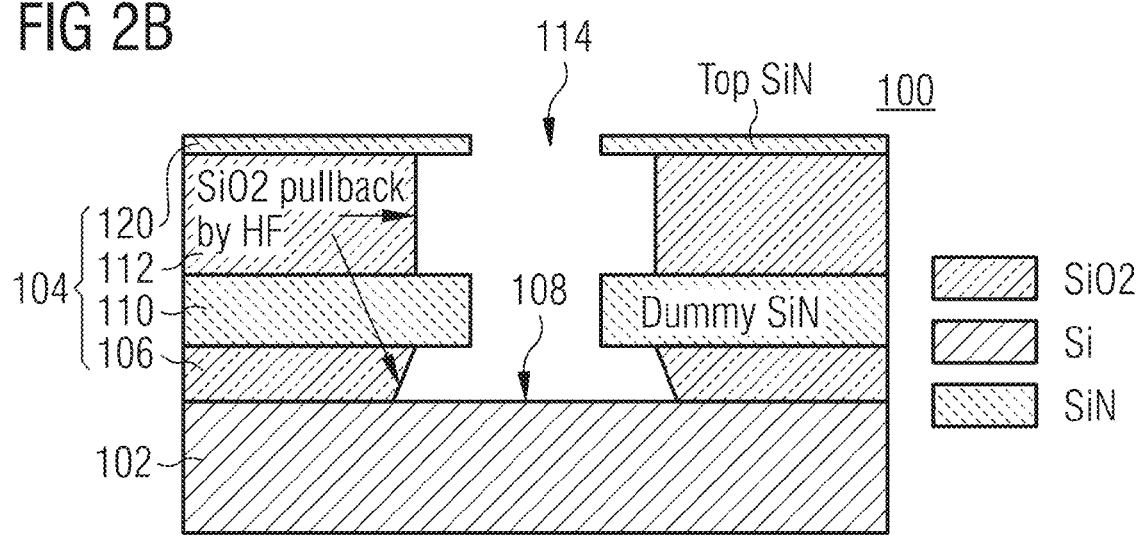
FIG. 2b shows a schematic cross-sectional view of the bipolar junction transistor after providing the substrate and the layer stack arranged on the substrate according to a further embodiment.

FIG. 2b shows a schematic cross-sectional view of the bipolar junction transistor 100 after providing the substrate 102 and the layer stack 104 arranged on the substrate 102, according to a further embodiment. Compared to FIG. 2a, the layer stack 104 may optionally further comprise a top layer (or top mask) 120 arranged on the second isolation layer 112. The top layer 120 can be, for example, a SiN layer (or SiN hardmask). Thereby, the window 114 can be formed in the layer stack 104 also through the top layer 120.

Figure 2C:
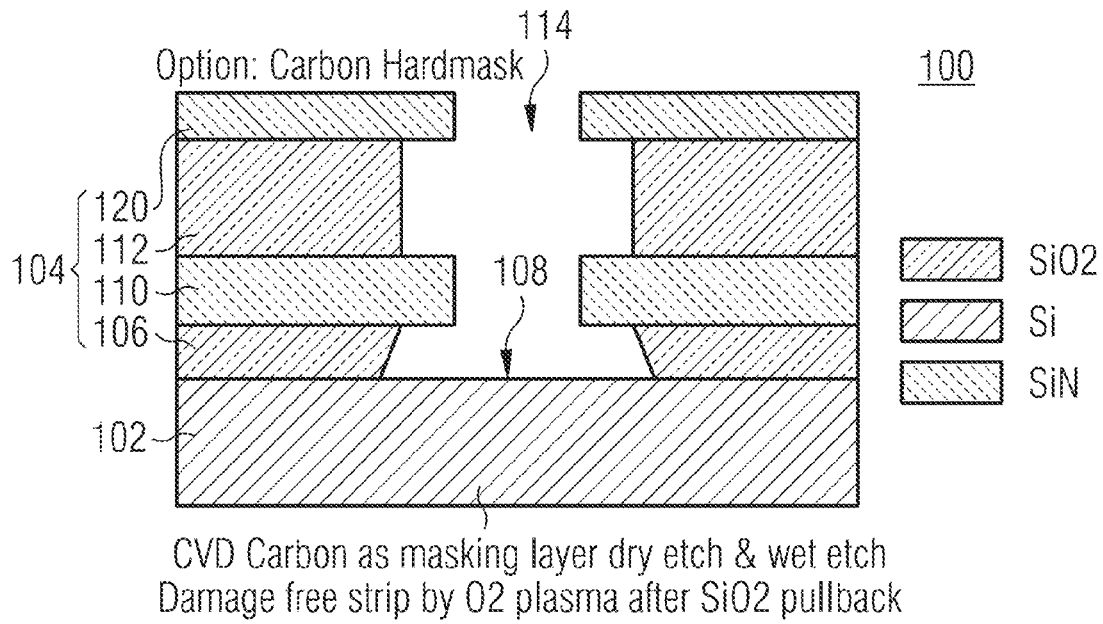
FIG. 2c shows a schematic cross-sectional view of the bipolar junction transistor after providing the substrate and the layer stack arranged on the substrate according to a further embodiment.

FIG. 2c shows a schematic cross-sectional view of the bipolar junction transistor 100 after providing the substrate 102 and the layer stack 104 arranged on the substrate 102, according to a further embodiment. Compared to FIG. 2a, the layer stack 104 may optionally further comprise a top layer (or top mask) 120 arranged on the second isolation layer 112. The top layer 120 can be, for example, a carbon layer (or carbon hardmask). The carbon layer can be manufactured using chemical vapor deposition (CVD). Thereby, the window 114 can be formed in the layer stack 104 also through the top layer 120.

As indicated in FIGS. 2b and 2c, the first isolation layer 106 and the second isolation layer 112 may comprise a pullback with respect to the sacrificial layer 110 and the optional top layer 120. For example, as already mentioned, the first isolation layer 106 and the second isolation layer 112 can be $SiO_2$ layers, wherein in that case the pullback may be achieved using a HF etch process (HF=hydrofluoric acid).

Figure 2D:
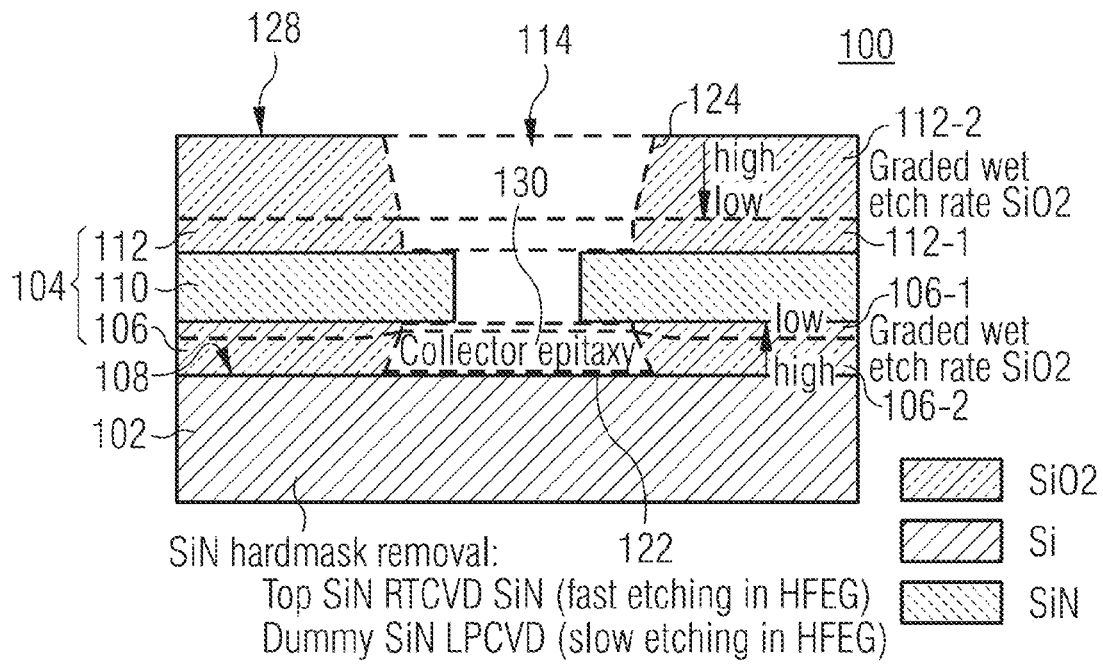
FIG. 2d shows a schematic cross-sectional view of the bipolar junction transistor after removing the top layer shown in FIGS. 2b and 2c, according to an embodiment.

FIG. 2d shows a schematic cross-sectional view of the bipolar junction transistor 100 after removing the top layer 120 shown in FIGS. 2b and 2c. As discussed with respect to FIGS. 2b and 2c, the top mask 120 can be a SiN hardmask or a carbon hardmask, respectively. A SiN hardmask can be removed, for example, by a top SiN RTCVD (RTCVD=rapid thermal chemical vapor deposition) SiN (fast etching in HFEG (HFEG=hydrofluoric ethylene glycol (HFEG). or by a dummy SiN LPCVD (LPCVD=low pressure chemical vapor deposition) (slow etching in HFEG). A (CVD) carbon hardmask (as the masking layer) can be removed by a dry and/or wet etch process, or by a damage free strip by $O_2$ (oxygen) plasma after the $SiO_2$ pullback.

As shown in FIG. 2d, the window 114 formed in the layer stack 104 can comprise a trapezoidal form in at least one out of a first area 122 between the first isolation layer 106 and a second area 124 between the second isolation layer 112. In FIG. 2d, the window 114 of the layer stack 104 comprises both a trapezoidal form in the first area 122 in between the first isolation layer 106 and a trapezoidal form in the second area 124 in between the second isolation layer 112. Thereby, the shorter one of the two bases of the trapezoidal form of the first area 122 between the first isolation layer can be facing the sacrificial layer 110. Similarly, the shorter one of the two bases of the trapezoidal form of the second area 124 between the second isolation layer can be facing the sacrificial layer 110.

In other words, flanks of at least one out of the first isolation layer 106 and the second isolation layer 112 facing the window 114 of the layer stack 104 can be at least partially rounded or beveled (tapered). Thereby, the flanks of at least one out of the first isolation layer 106 and second isolation layer 112 can be at least partly rounded or beveled such that an opening of the window 114 is smaller towards the sacrificial layer 110 than towards a surface region 108 of the substrate 102 or an upper surface region 128 of the second isolation layer 112. For example, at least one out of the first isolation layer 106 and the second isolation layer 112 can be a $SiO_2$ layer. In that case, flanks that are at least partially rounded or beveled can be achieved by means (or using) a high density plasma (HDP) process, e.g. HDP $SiO_2$.

Further, at least one out of the first isolation layer 106 and the second isolation layer 112 can comprise a first isolation sublayer 106_1 and 112_1 having a first etch rate and a second isolation sublayer 106_2 and 112_2 having a second etch rate different from the first etch rate.

As already mentioned, at least one out of the first isolation layer 106 and the second isolation layer 112 can be a $SiO_2$ layer. In that case, the first isolation sublayer 106_1 and 112_1 can be a HDP $SiO_2$ sublayer, e.g. a $SiO_2$ layer manufactured using a high density plasma process, wherein the second isolation sublayer 106_2 and 112_2 can be a conformal $SiO_2$ sublayer. Thereby, for the first isolation layer 106, the second isolation sublayer (conformal $SiO_2$ sublayer) 106_2 may be arranged on the substrate 102, wherein the first isolation sublayer (HDP $SiO_2$ sublayer) 106_1 may be arranged on the second isolation sublayer (conformal $SiO_2$ sublayer) 106_2. For the second isolation layer 112 the first isolation sublayer (HDP $SiO_2$ sublayer) 112_1 may be arranged on the sacrificial layer 110, wherein the second isolation sublayer (conformal $SiO_2$ sublayer) 112_2 may be arranged on the first isolation sublayer (HDP $SiO_2$ sublayer) 112_1.

The graded wet etch rates of the first and second $SiO_2$ layers 106 and 112 are indicated in FIG. 2d by the arrows from high to low. The at least partly rounding or tapering of the first and/or second isolation layer 106 and 112 may be achieved by a short hot PHOS (PHOS=) or HFEG. For example, the taper of the first and/or second isolation layer 106 and 112 may be achieved by a dilute HF wet etch or by a dry etch.

Note that the above described shape of the layer stack 104 may also be achieved without the optional top layer 120 shown in FIGS. 2b and 2c.

Compared to FIG. 2a, FIG. 2d further shows a collector layer 130 of the first semi conductive type provided on the substrate 102 within the window 140 of the layer stack 104. For example, the collector layer 130 may be epitaxially grown on the substrate 102 (and on the first isolation layer 106) within the window 114 of the layer stack 104. The collector layer 130 can be a silicon collector layer.

Figure 2E:
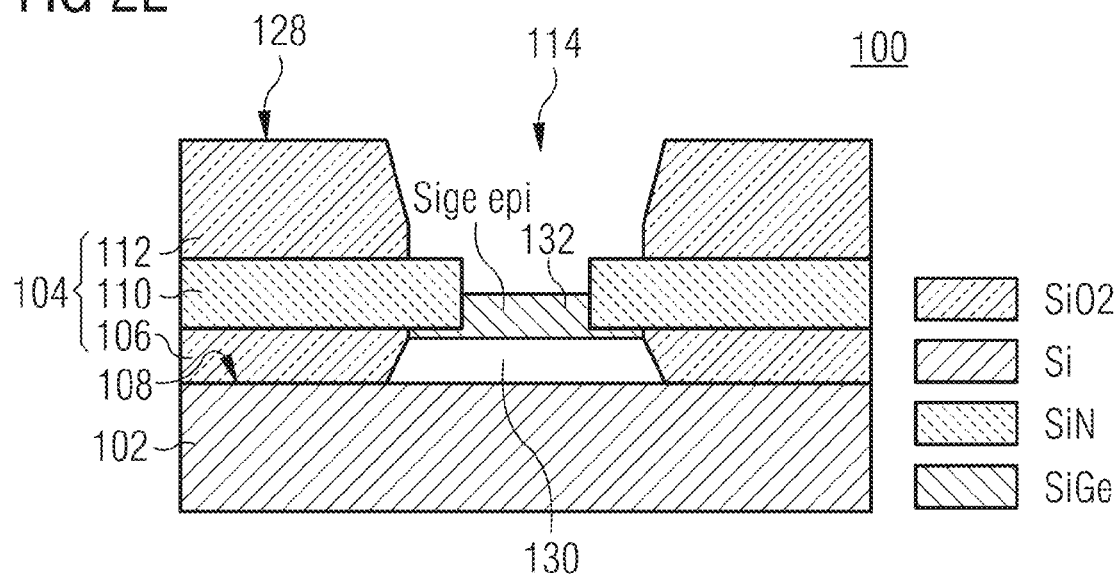
FIG. 2e shows a schematic cross-sectional view of the bipolar junction transistor after providing a base layer of a second semi conductive type on the collector layer within the window of the layer stack, according to an embodiment.

FIG. 2e shows a schematic cross-sectional view of the bipolar junction transistor 100 after providing a base layer 132 of a second semi conductive type on the collector layer 130 within the window 114 of the layer stack 104. For example, the base layer 132 may be epitaxially grown on the collector layer 130 within the window 114 of layer stack 104. The base layer can be a SiGe (silicon-germanium) layer. Thus, the bipolar junction transistor (BJT) 100 can be a heterojunction bipolar transistor (HBT).

Figure 2F:
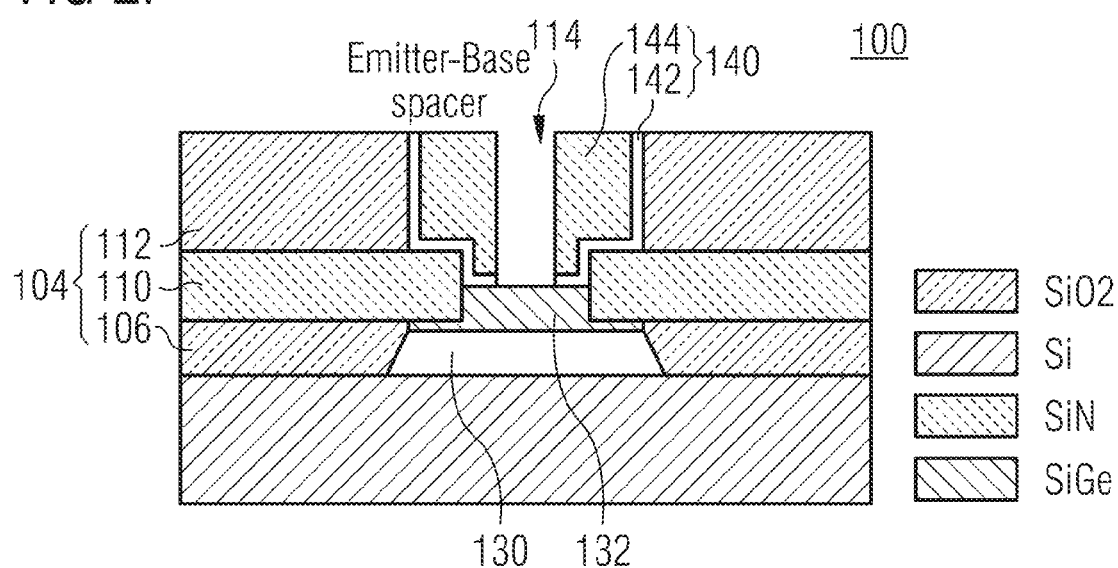
FIG. 2f shows a schematic cross-sectional view of the bipolar junction transistor after providing a spacer on sidewalls of the window of the layer stack, according to an embodiment.

FIG. 2f shows a schematic cross-sectional view of the bipolar junction transistor 100 after providing a spacer (emitter-base spacer) 140 on sidewalls of the window 114 of the layer stack 104. The spacer 140 may comprise a $SiO_2$ layer 142 provided on sidewalls of the window 114 of the layer stack 104. Optionally, the spacer may further comprise a SiN layer 144 provided on the $SiO_2$ layer 142.

Figure 2G:
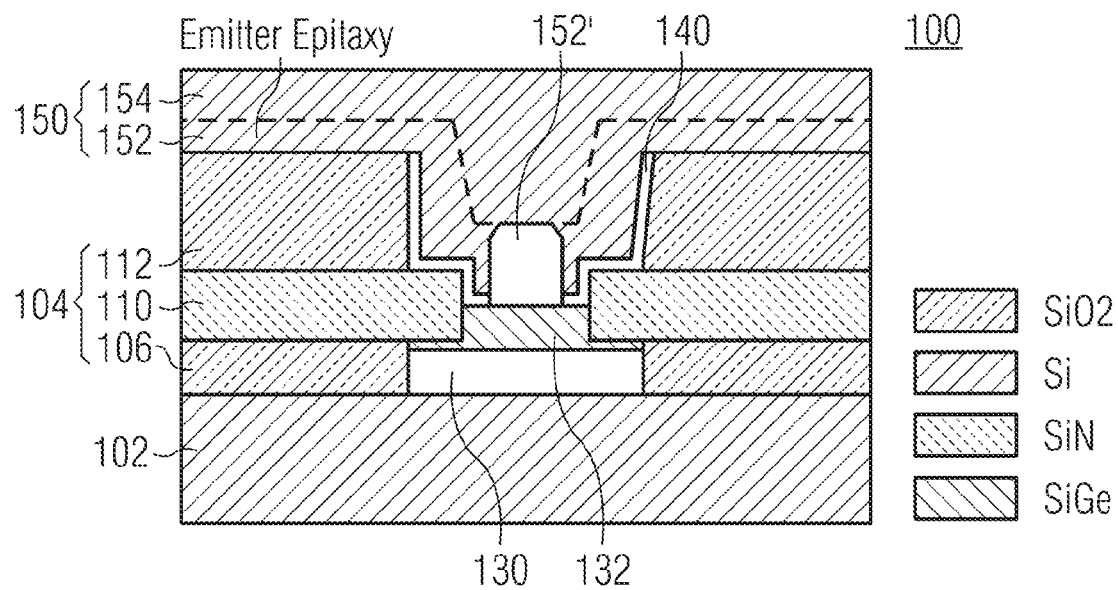
FIG. 2g shows a schematic cross-sectional view of the bipolar junction transistor after providing an emitter layer stack comprising an emitter layer on the base layer within the window of the layer stack, such that an overfill of the window of the layer stack is achieved, according to an embodiment.

FIG. 2g shows a schematic cross-sectional view of the bipolar junction transistor 100 after providing an emitter layer stack 150 comprising an emitter layer 152 on the base layer 132 (and on the spacer 140) within the window 114 off layer stack 104, such that an overfill of the window 114 of the layer stack 104 is achieved. The emitter layer 152 can be of the first semi conductive type.

Providing the emitter layer stack 150 can comprise growing the emitter layer 152 on the base layer 132 within the window 114 of the layer stack 104 and depositing an optional cap layer 154 on the emitter layer 152. For example, the emitter layer can be epitaxially grown on the base layer 132. Thereby, in FIG. 2g a monocrystalline grown portion of the emitter layer 152 is indicated with reference numeral 152'. The cap layer 154 can be a polysilicon cap layer. The polysilicon cap layer 154 can be deposited using a process that avoids a void in the polysilicon cap layer 154. For example, LPCVD (LPCVD=low pressure chemical vapor deposition) can be used for depositing the polysilicon cap layer 154.

Instead of providing the emitter layer stack 150 comprising the emitter layer 152 and the cap layer 154, it is also possible to provide (only) an emitter layer 152 on the base layer 132 within the window 114 of the layer stack 104, such that an overfill of the window 114 of the layer stack 104 is achieved.

As shown in FIG. 2g, the emitter width (EW) can be tapered in order to avoiding seam.

Figure 2H:
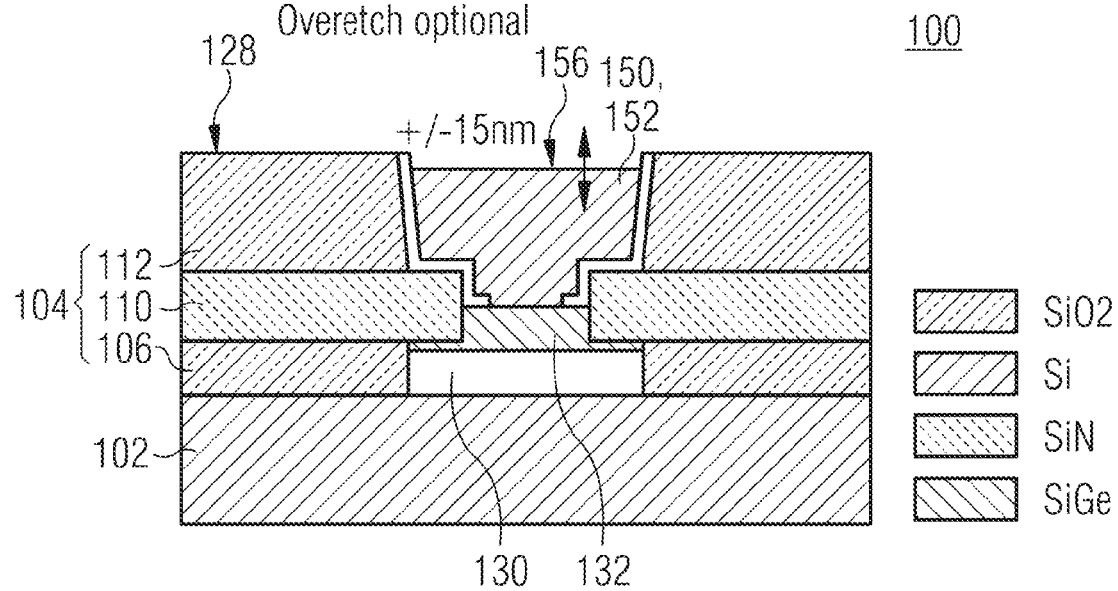
FIG. 2h shows a schematic cross-sectional view of the bipolar junction transistor after selectively removing the emitter layer or emitter layer stack at least up to the second isolation layer, according to an embodiment.

FIG. 2h shows a schematic cross-sectional view of the bipolar junction transistor 100 after selectively removing the emitter layer 152 or emitter layer stack 150 at least up to the second isolation layer 112. As indicated in FIG. 2h, optionally the emitter layer 152 or the emitter layer stack 150 can be selectively removed until an overetch of the emitter layer 152 or emitter layer stack 150 within the window 114 of the layer stack 104 is achieved, such that an upper surface region 156 of the emitter layer stack 150 or emitter layer 152 is lower than the upper surface region 128 of the second isolation layer 112.

For example, the emitter layer 152 or emitter stack layer 150 can be selectively removed using a dry etch process. Naturally, also a wet etch process may be used. Further, the etch process may be an isotropic etch process. In other words, an isotropic recess with endpoint can be used for removing the emitter layer 152 or emitter layer stack 150. Optionally, an overetch of, for example, ±15 nm may be achieved. For example, an emitter having a width of 220 nm may have a resulting height between 30 nm and 80 nm.

Observe that the expression "selectively removing" used herein means that (substantially) only the emitter layer 152 or emitter layer stack 150 is removed, or in other words, that the emitter layer 152 or emitter layer stack 150 is removed without removing the second isolation layer 112.

The first semi conductive type can be a n-type, i.e. a semiconductor material comprising primarily free electrons as charge carriers, wherein the second semi conductive type can be a p-type, i.e. a semiconductor material comprising primarily free holes as charge carriers.

The above described method 10 for manufacturing the bipolar junction transistor 100 can be advantageously used for manufacturing a BiMOS device. BiMOS is a semiconductor technology that integrates a bipolar junction transistor and a MOS device (MOS=metal-oxide-semiconductor), e.g., a MOS transistor, in one single integrated circuit device.

Figure 3:
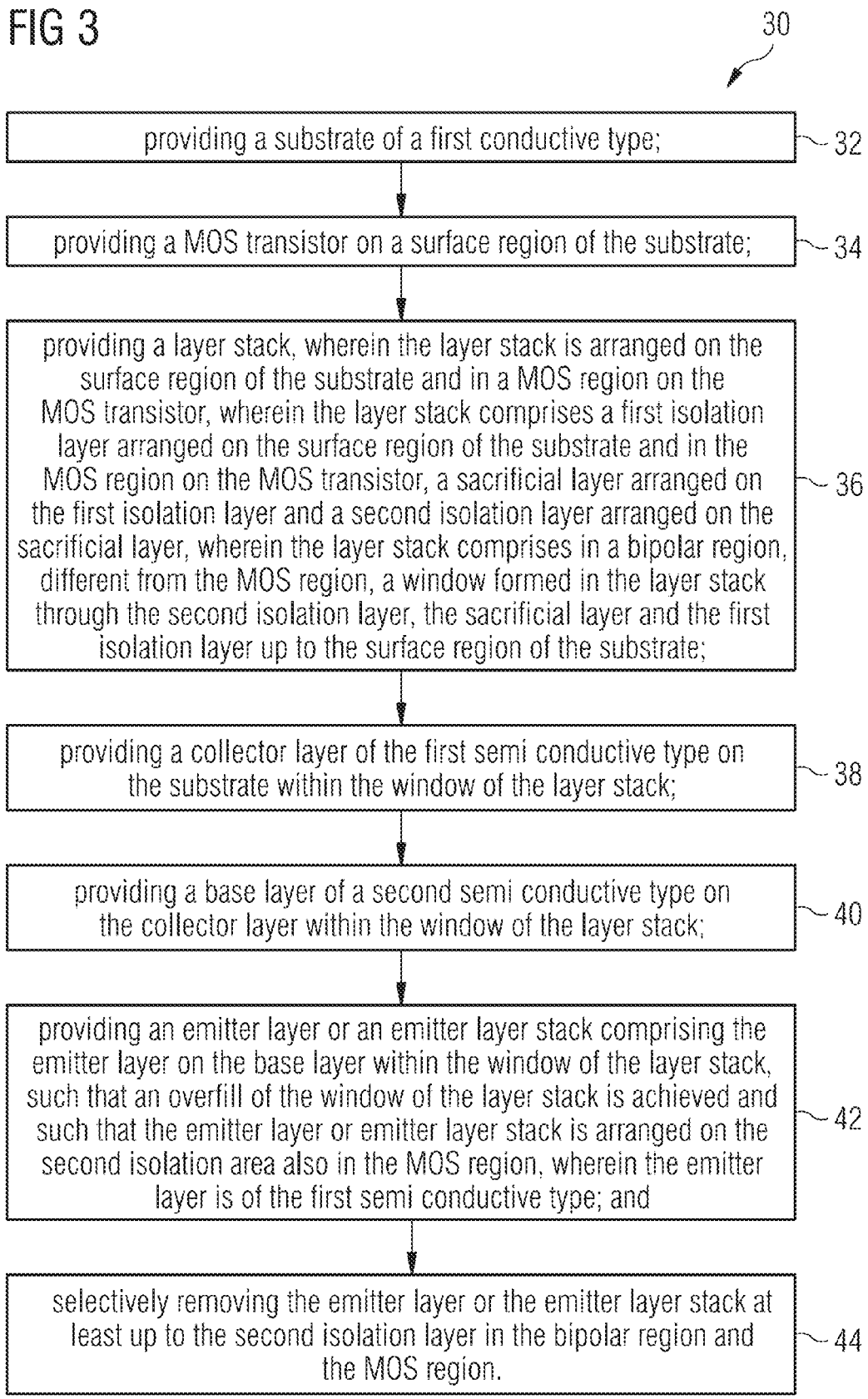
FIG. 3 shows a flowchart of a method for manufacturing a BiMOS device according to an embodiment.

FIG. 3 shows a flowchart of a method 30 for manufacturing a BiMOS transistor device, i.e. a bipolar junction transistor and a MOS device (e.g., MOS transistor) on the same substrate. The method comprises a step 32 of providing a substrate of a first conductive type. The method further comprises a step 34 of providing a MOS device (e.g., a MOS transistor, MOS resistor or a capacitor) on a surface region of the substrate. The method further comprises a step 36 of providing a layer stack, wherein the layer stack is arranged on the surface region of the substrate and in a MOS region on the MOS device, wherein the layer stack comprises a first isolation layer arranged on the surface region of the substrate and in the MOS region on the MOS device, a sacrificial layer arranged on the first isolation layer and a second isolation layer arranged on the sacrificial layer, wherein the layer stack comprises in a bipolar region, different from the MOS region, a window formed in the layer stack through the second isolation layer, the sacrificial layer and the first isolation layer up to the surface region of the substrate. The method further comprises a step 38 of providing a collector layer of the first semi conductive type on the substrate within the window of the layer stack. The method further comprises a step 40 of providing a base layer of a second semi conductive type on the collector layer within the window of the layer stack. The method further comprises a step 42 of providing an emitter layer or an emitter layer stack comprising the emitter layer on the base layer within the window of the layer stack, such that an overfill of the window of the layer stack is achieved and such that the emitter layer or emitter layer stack is arranged on the second isolation area also in the MOS region, wherein the emitter layer is of the first semi conductive type. The method further comprises a step 44 of selectively removing the emitter layer or the emitter layer stack at least up to the second isolation layer in the bipolar region and the MOS region.

Subsequently it is assumed that the MOS device is a MOS transistor. However, the MOS device could also be a resistor or a capacitor causing the same or similar topography than the MOS transistor.

In the following, the method 30 for manufacturing the BiMOS device is described in detail with respect to FIGS. 4a to 4c, which show schematic cross-sectional views of the BiMOS device after different steps of the method 30 for manufacturing the BiMOS device.

FIG. 4a shows a schematic cross-sectional view of a BiMOS device 200 before selectively removing the emitter layer 152 or the emitter layer stack 150 at least up to the second isolation layer 112 in the bipolar region and in the MOS region.

Further, FIG. 4a shows in the bipolar region of the BiMOS device 200 a bipolar junction transistor 100. The bipolar junction transistor 100 of the BiMOS device 200 is equal or equivalent to the bipolar junction transistor 100 shown and discussed throughout FIGS. 1 to 2h, such that the description thereof is also applicable to the bipolar junction transistor 100 of the BiMOS device 200 shown in FIGS. 4a to 4c.

In addition, FIG. 4a shows in a MOS region of the BiMOS device 200 a MOS transistor 202, or more precisely, a gate of the MOS transistor 202. The layer stack 104 is arranged in the MOS region on the MOS transistor 202 and in an area surrounding the MOS transistor 202 on the substrate 102.

The layer stack 104 can be provided on the surface region 108 of the substrate and on the MOS transistor 202 such that a leveling of the second isolation layer 112 caused by the buried MOS transistor 202 (buried under the layer stack 104) comprises a maximum inclination of 30° (or 20° or 10° or 5°) relative to the surface region 108 of the substrate 102. In other words, as indicated in FIG. 4a, the layer stack 104 can be provided such that a sidewall angle smaller than 30° is achieved, which is desired for a residual free poly recess process.

Further, as indicated in FIG. 4a, a distance (along a geometrical line parallel to the surface 108 of the substrate 102) of 1.5 µm or less between the bipolar junction transistor 100 and the MOS transistor 202, or more precisely, between a sidewall 141 of the spacer 140 facing the MOS transistor 202 and a sidewall 203 of the gate of the MOS transistor 202, is achievable by the method 30 for manufacturing the BiMOS device 200 disclosed herein. In contrast to this, a conventional CMP based manufacturing method would require a distance of more than 10 µm to remove material from lower lying regions.

Further, a distance between a face (or sidewall) of the emitter window 114 facing the MOS transistor 202 and a face (or sidewall) 203 of a gate (MOS device poly (gate conductor, or poly conductor) of the MOS transistor 202 facing the bipolar junction transistor 100 can be smaller than 200 nm, 500 nm, 1 µm, 1.5 µm or 3 µm.

For 130 nm and 90 nm technology, a target gate contact height is 150 nm, wherein a minimum of 120 nm and a maximum of 180 nm is estimated.

Further, as can be derived from FIG. 4a, there are no pinching structures in the MOS region due to the HDP step coverage (HDP=high density plasma).

FIG. 4b shows a schematic cross-sectional view of the BiMOS device 200 after selectively removing the emitter layer 152 or the emitter layer stack 150 at least up to the second isolation layer 112 in the bipolar region and in the MOS region. Thereby, the emitter layer 152 or the emitter layer stack 150 is removed in the bipolar region and in the MOS region up to the second isolation layer 112 without removing the layer stack 104, or more precisely, the second isolation layer 112.

In FIG. 4b several distances or heights are indicated by arrows. In detail, D1 indicates a height of the first isolation layer 106. D2 indicates a height of the sacrificial layer 110. D3 indicates a height of the MOS transistor 202, or more precisely, of the gate contact of the MOS transistor 202. D4 indicates a height of the collector layer 130 and base layer 132. D5 indicates a distance between a top surface region of the sacrificial layer 110 and the top surface region 156 of the emitter layer in the bipolar region. D6 indicates a height of the emitter layer 152 or emitter layer stack 150.

The emitter layer 152 or the emitter layer stack 150 can be removed in the bipolar region and in the MOS region up the second isolation layer 112 such that a distance between the surface region 108 of the substrate 102 and an upper surface region 156 of the emitter layer 152 or emitter layer stack 150 of the bipolar junction transistor 100 is smaller than a distance between the surface region 108 of the substrate 102 and an upper surface region 157 of the sacrificial layer 110 in the MOS region (directly above the MOS transistor 202). In other words, a top level 156 of the emitter electrode may be closer to the silicon substrate 102 than D1+D2+D3.

Further, the emitter layer 152 or the emitter layer stack 150 can be removed such that a distance between the surface region 108 of the substrate 102 and the upper region 156 of the emitter layer 152 or emitter layer stack 150 of the bipolar junction transistor 100 is smaller than a distance between the surface region 108 of the substrate 102 and an upper surface region 158 of the first isolation layer 106 in the MOS region (above the MOS transistor 202). In other words, a top level 156 of the emitter electrode may be closer to the silicon substrate 102 than D1+D3.

Further, the emitter layer 152 or emitter layer stack 150 can be removed such that a distance between the surface region 108 of the substrate 102 and an upper region 156 of the emitter layer 152 or emitter layer stack 150 is smaller than or equal to a distance between the surface region 108 of the substrate 102 and an upper surface region 160 of the MOS transistor 202. In other words, a top level 156 of the emitter electrode can be closer to the silicon substrate 102 than D3. This is the most aggressive case. It allows a shorter HBT stack (HBT=heterojunction bipolar transistor) and thus a faster device.

In the following, target dimensions for a SiGe heterojunction bipolar transistor are given. A height D1 of the first isolation layer 106 can be between 50 and 85 nm (smaller values for high performance). A height D2 of the sacrificial layer 110 can be between 40 and 80 nm (idem). A height D3 of the MOS transistor (or MOS gate) 202 can be between 105 and 190 nm (lower limit by reliability, example: 90 nm technology. A height D4 of the collector layer 130 and base layer 132 together can be 65 to 125 nm (smaller is faster). The distance D5 between the top surface region of the sacrificial layer 110 and the top surface region 156 of the emitter layer in the bipolar region can be between 0 and 40 nm. A height of the emitter layer 152 or emitter layer stack 150 can be between 40 to 60 nm (minimum limited by silicidation process).

FIG. 4c shows a schematic cross-sectional view of a final BiMOS device 200 according to an embodiment. Compared to FIG. 4b, in the bipolar region the sacrificial layer 110 has been replaced by a contact layer 170 contacting the base layer 132 of the bipolar junction transistor 100. Further, a SiN layer 172 has been provided on the substrate 102, in the bipolar region on the contact layer 170 and emitter layer 152 or emitter stack layer 150, and in the MOS region on the MOS transistor 202, or more precisely, on the gate of the MOS transistor 202. Furthermore, contacts 180 contacting via the contact layer 170 the base layer 132, the emitter layer 152, the gate of the MOS transistor 202 and a source/drain of the MOS transistor 202 have been provided.

In FIG. 4c, the distances D1 to D5 already indicated in FIG. 4b are also indicated.

Thereby, the upper surface region 156 of the emitter layer 152 or emitter layer stack 150 of the bipolar junction transistor 100 can be smaller than a sum of a distance between the surface region 108 of the substrate 102 and an upper surface region of the contact layer 170 in the bipolar region and a distance between the surface region 108 of the substrate 102 and an upper surface region 160 of the MOS transistor 202 in the MOS region. In other words, a top level 156 of the emitter electrode may be closer to the silicon substrate 102 than D1+D2+D3.

Further, a distance between the surface region 108 of the substrate 102 and an upper surface region 156 of the emitter layer 152 or emitter layer stack 150 of the bipolar junction transistor 100 can be smaller than a sum of a distance between the surface region 108 of the substrate 102 and an upper surface region 173 of the first isolation layer 106 in the bipolar region and a distance between the surface region 108 of the substrate 102 and the upper surface region 160 of the MOS transistor 202 in the MOS region. In other words, a top level 156 of the emitter electrode may be closer to the silicon substrate 102 than D1+D3.

Further, a distance between the surface region 108 of the substrate 102 and an upper region of the emitter layer 152 or emitter layer stack 150 of the bipolar junction transistor 100 can be smaller than or equal to a distance between the surface region 108 of the substrate 102 and an upper surface region 160 of the MOS transistor in the MOS region. In other words, a top level 156 of the emitter electrode may be closer to the silicon substrate 102 than D3.

FIG. 5a shows a schematic cross-sectional view of the BiMOS device 202 after providing the emitter layer stack 150 comprising the emitter layer 152 on the base layer 132 within the window 114 of the layer stack 104, such that an overfill of the window 114 of the layer stack 104 is achieved and such that the emitter layer stack 150 is arranged on the second isolation layer 112 also in the MOS region (not shown in FIG. 5a). Thus, FIG. 5a substantially shows the same as FIG. 4a, such that the description of FIG. 4a is also applicable to the BiMOS device 202 shown in FIG. 5a. However, compared to FIG. 4a, in FIG. 5a further an emitter width (EW), a height of the polysilicon layer 154 and a divot are indicated by arrows. Further, in FIG. 5a a height h is indicated describing a height of the polysilicon emitter layer 154 directly above the emitter layer 152.

Thereby, FIG. 5a shows a special case where a thickness or height r0 of the polysilicon emitter layer 154 is equal to the emitter width (EW_CD). In that case, the divot depth can be calculated to:

Divot depth=(1−sqrt(1.25))*EW_CD.

In general the general case, the divot depth can be calculated to:

(r0−h)/r0=1−sqrt(1−(e/(2r0))^2)

Therefore, a divot of ~20 nm (or smaller) for a 400 nm deposition is expected.

FIG. 5b shows in a diagram the ratio of the resulting divot from a conformal deposition to the deposition thickness (divot/dep) for an emitter width (EW_CD) of 250 nm. Thereby, the ordinate describes the ratio of the divot depth to the deposited film thickness and the abscissa describes the deposited film thickness.

FIG. 5c shows in a table a divot depth (relative divot depth and absolute divot depth) as a function of a deposited silicon thickness and emitter width. Further, in FIG. 5c the relation (r0−h)/r0=1−sqrt(1−(e/(2r0))^2) is given. Thereby, in FIG. 5c, arrows indicate possible target configurations. All values are indicated in nm.

Figure 6A:
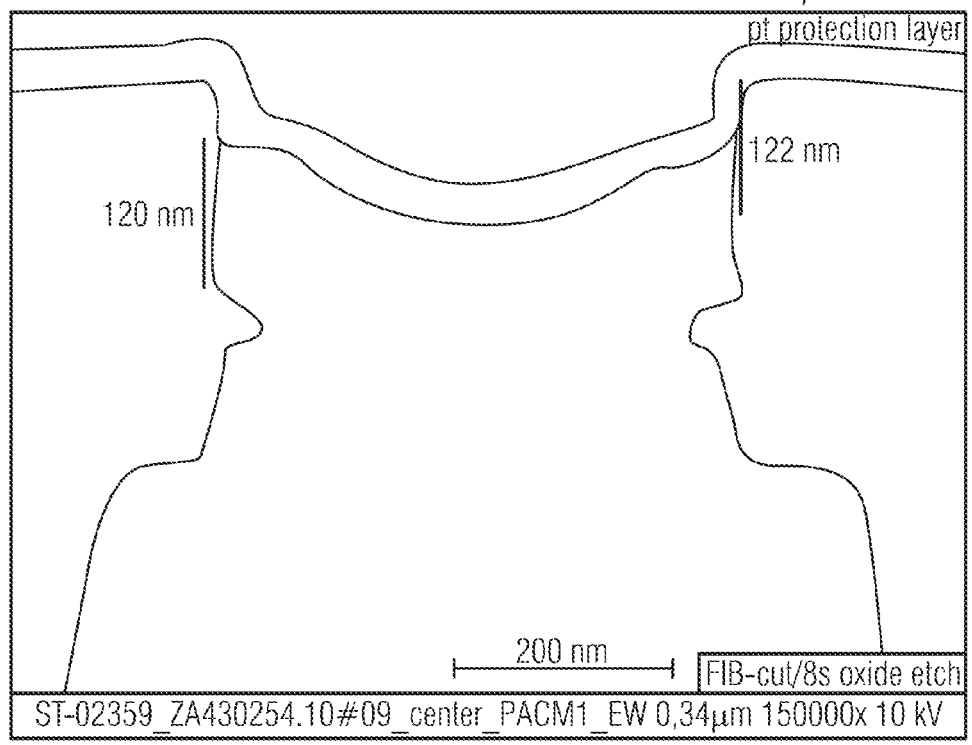
FIG. 6a shows a scanning electron microscope image of the bipolar region of the BiMOS device.
Figure 6B:
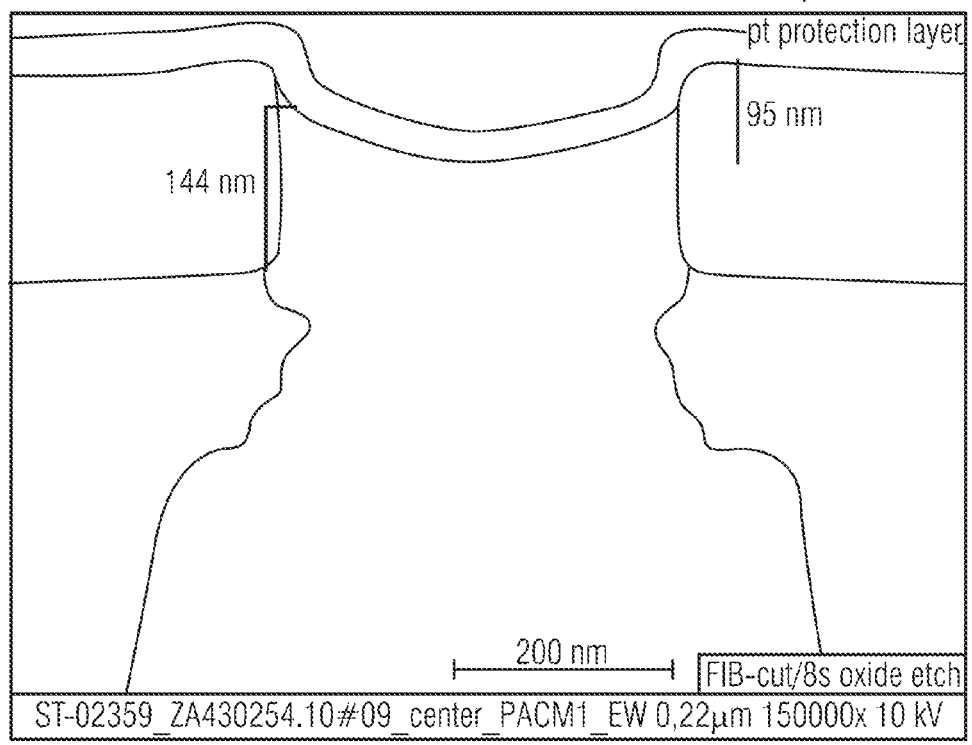
FIG. 6b shows a scanning electron microscope image of the bipolar region of the BiMOS device.

FIGS. 6a and 6b show scanning electron microscope images of bipolar regions of BiMOS device 200 windows, which were filled with emitter material and subsequently recessed to a potential target depth. Further, FIG. 6a, and FIG. 6b show recess depths of 122 nm and 95 nm which closely match the predicted difference derived from the recess depth calculation shown in FIG. 5c for the emitter recess are indicated.

It is noted that for FIGS. 6a and 6b, from divot calculation a difference of 25 nm is expected.

Figure 6C:
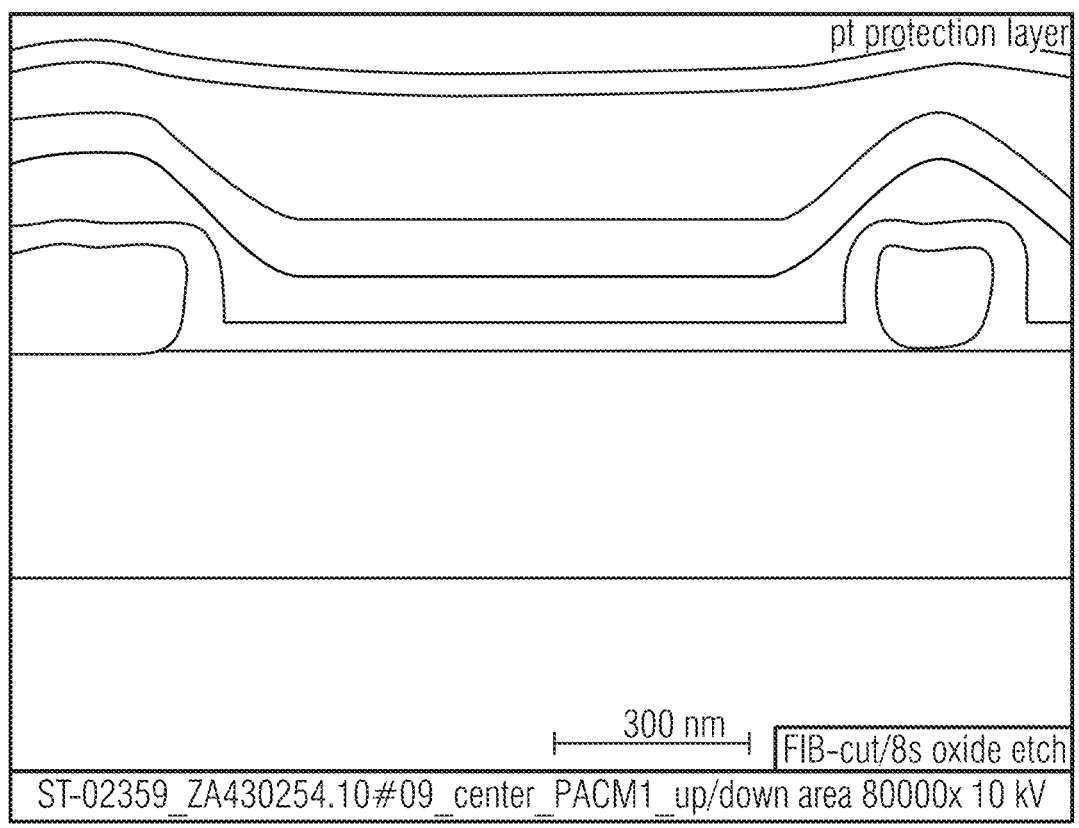
FIG. 6c shows a scanning electron microscope image of the MOS region of the BiMOS device.

FIG. 6c shows a scanning electron microscope image of the MOS region of the BiMOS device 200. From FIG. 6c it can be seen that the process enables a surprisingly flat final topography.

Figure 7A:
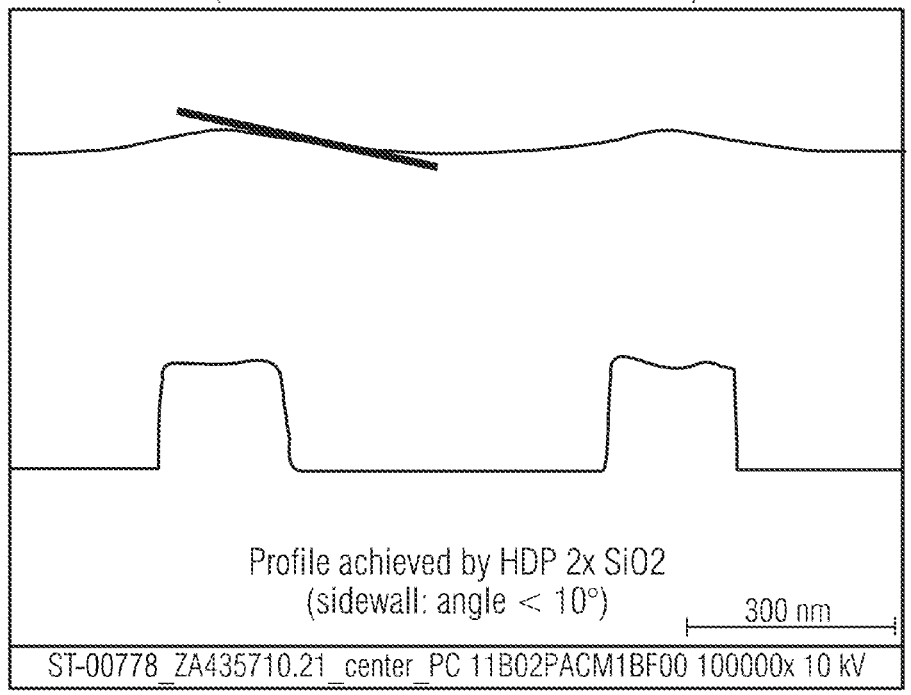
FIG. 7a shows a scanning electron microscope image of the MOS region of the BiMOS device with a new dielectric stack.

FIG. 7a shows a scanning electron microscope image of the MOS region of the BiMOS device with a new dielectric stack (LPCVD & HDP $SiO_2$/LPSiN/HDP $SiO_2$). The profile achieved by HDP 2× $SiO_2$ has a sidewall angle smaller than 10°.

Figure 7B:
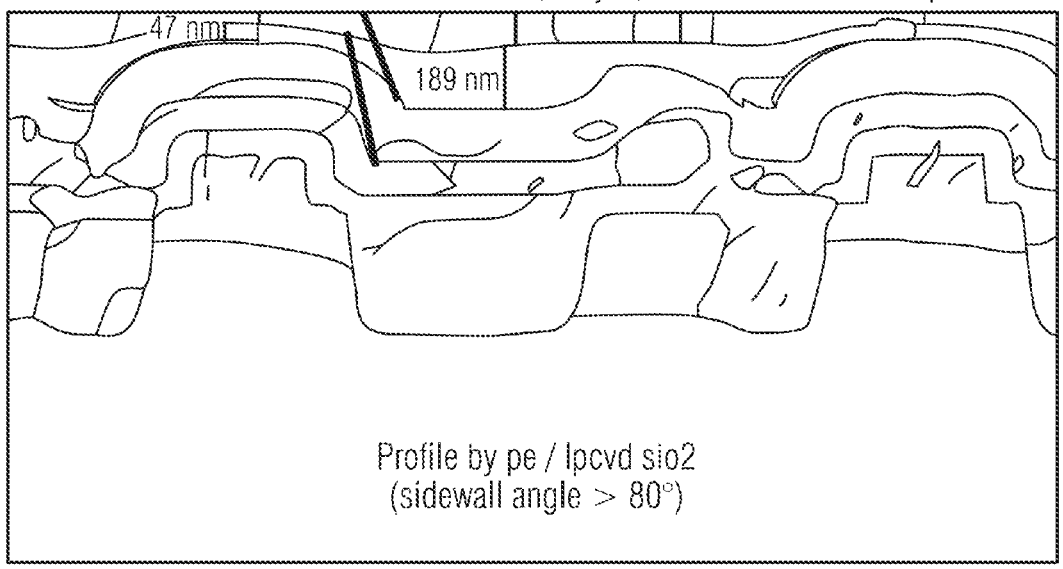
FIG. 7b shows a scanning electron image of a step coverage of a conventional deposition on a CMOS gate topography.

FIG. 7b shows a scanning electron image of a step coverage of a conventional deposition on a CMOS gate topography. Note that this is not the target stack, different technology (LPCVD SiO2, PolySi, SiN, from bottom to top).

As becomes clear after the above discussion, a BiMOS (or BiCMOS) architecture wherein the emitter is to be produced in a self-aligned way relative to the collector and the base is provided. At present, the emitter silicon is patterned by means of a damascene process. However, this process flow inevitably results in the upper edge of the emitter silicon to be located above the upper edge of the CMOS gate.

Due to the longer feed line length, this result in an increase in the emitter resistance, which has a negative impact on the switching frequency of the bipolar device. This problem is solved by the methods for manufacturing disclosed herein, the height of the emitter no longer being linked directly to the height of the MOS gate. Further, process tolerances and process complexity are reduced at the same time.

Up to now, the emitter has been patterned by a poly-CMP process, as described before, including a stop on a PC topography. The results were the above described problems relating to pattern breaking at the wafer edge and a strong dependence of the emitter height on the specific layout (occupancy density, surroundings) of more than ±30 nm among various layouts.

Instead of using a CMP process including pre-planarization, an advantageous combination of depositions and recess processes based on dry-etching is suggested.

Thus, an advantage is that the emitter height may be set to be independent of the MOS gate height, in particular, to be considerably lower than the MOS gate height. This allows minimizing the feed line resistance of the emitter. Further, an advantage is that vertical tolerances are expected to be reduced to less than half the value, thereby reducing the tolerances of electrical parameters considerably. For HBTs (heterojunction bipolar transistors) with fmax>500 GHz, the feed line resistance of an emitter is a decisive quantity for the device performance. Further, an advantage is that the process costs may be reduced, since expensive CMP processes can be avoided.

Embodiments provide an HBT architecture wherein the emitter height may be set to be independent of the MOS topography in order to minimize feed line resistances.

The invention claimed is:

1. A method for manufacturing a bipolar junction transistor, the method comprising:
providing a substrate of a first conductive type and a layer stack arranged on the substrate, wherein the layer stack comprises a first isolation layer arranged on a surface region of the substrate, a sacrificial layer arranged on the first isolation layer and a second isolation layer arranged on the sacrificial layer, wherein the layer stack comprises a window formed in the layer stack through the second isolation layer, the sacrificial layer, and the first isolation layer up to the surface region of the substrate;

providing a collector layer of a first semi conductive type on the substrate within the window of the layer stack;

providing a base layer of a second semi conductive type on the collector layer within the window of the layer stack;

providing an emitter layer or an emitter layer stack comprising the emitter layer on the base layer within the window of the layer stack, such that an overfill of the window of the layer stack is achieved, wherein the emitter layer is of the first semi conductive type; and selectively removing the emitter layer or the emitter layer stack at least up to the second isolation layer.

2. The method for manufacturing according to claim 1, wherein the window formed in the layer stack comprises a trapezoidal form in at least one of a first area between the first isolation layer or a second area between the second isolation layer.

3. The method for manufacturing according to claim 1, wherein flanks of at least one of the first isolation layer or second isolation layer facing the window of the layer stack are at least partly rounded or beveled.

4. The method for manufacturing according to claim 1, wherein providing the emitter layer comprises growing the emitter layer on the base layer within the window of the layer stack.

5. The method for manufacturing according to claim 1, wherein providing the emitter layer stack comprises growing the emitter layer on the base layer within the window of the layer stack and depositing a cap layer on the emitter layer.

6. The method for manufacturing according to claim 1, wherein a spacer is provided on sidewalls of the window of the layer stack before the emitter layer or emitter layer stack is provided.

7. The method for manufacturing according to claim 1, wherein the emitter layer or the emitter layer stack is selectively removed until an over etch of the emitter layer or emitter layer stack within the window of the layer stack is achieved, such that an upper surface region of the emitter layer or emitter layer stack is lower than an upper surface region of the second isolation layer.

8. The method for manufacturing according to claim 1, wherein the emitter layer or the emitter layer stack is selectively removed using a dry etch process.

9. The method for manufacturing according to claim 1, wherein at least one of the first isolation layer or the second isolation layer comprise a relative permittivity of less than 9.

10. The method for manufacturing according to claim 1, wherein at least one of the first isolation layer or the second isolation layer comprises a first isolation sublayer having a first etch rate and a second isolation sublayer having a second etch rate different from the first etch rate.

11. The method for manufacturing according to claim 1, wherein the first isolation layer is a first SiO2 layer, and wherein the second isolation layer is a second SiO2 layer.

12. The method for manufacturing according to claim 1, wherein at least one of the first isolation layer or the second isolation layer is manufactured using a high density plasma process.

13. The method for manufacturing according to claim 1, wherein the sacrificial layer is a SiN layer.

14. A method for manufacturing a BiMOS device, the method comprising:
providing a substrate of a first conductive type;
providing a MOS device on a surface region of the substrate;
providing a layer stack, wherein the layer stack is arranged on the surface region of the substrate and in a MOS region on the MOS device, wherein the layer stack comprises a first isolation layer arranged on the surface region of the substrate and in the MOS region on the MOS device, a sacrificial layer arranged on the first isolation layer and a second isolation layer arranged on the sacrificial layer, wherein the layer stack comprises, in a bipolar region different from the MOS region, a window formed in the layer stack through the second isolation layer, the sacrificial layer, and the first isolation layer up to the surface region of the substrate;
providing a collector layer of a first semi conductive type on the substrate within the window of the layer stack;
providing a base layer of a second semi conductive type on the collector layer within the window of the layer stack;
providing an emitter layer or an emitter layer stack comprising the emitter layer on the base layer within the window of the layer stack, such that an overfill of the window of the layer stack is achieved and such that the emitter layer or emitter layer stack is arranged on the second isolation layer also in the MOS region, wherein the emitter layer is of the first semi conductive type; and
selectively removing the emitter layer or the emitter layer stack at least up to the second isolation layer in the bipolar region and the MOS region.

15. The method for manufacturing according to claim 14, wherein the emitter layer or the emitter layer stack is removed in the bipolar region and the MOS region up to the second isolation layer such that a distance between the surface region of the substrate and an upper region of the emitter layer or emitter layer stack of the bipolar region is smaller than a distance between the surface region of the substrate and an upper surface region of the sacrificial layer in the MOS region.

16. The method for manufacturing according to claim 14, wherein the emitter layer or the emitter layer stack is removed in the bipolar region and the MOS region up to the second isolation layer without removing the layer stack in the MOS region.

17. The method for manufacturing according to claim 14, wherein the layer stack is provided on the surface region of the substrate and on the MOS device such that a leveling of the second isolation layer caused by the MOS device comprises a maximum inclination of 30° relative to the surface region of the substrate.

18. The method for manufacturing according to claim 1, wherein at least one of the first isolation layer or the second isolation layer comprise a relative permittivity of less than 7.

19. The method for manufacturing according to claim 1, wherein at least one of the first isolation layer or the second isolation layer is a $SiO_2$ layer manufactured using a high density plasma process.

20. The method of manufacturing according to claim 1, wherein the layer stack comprises a mask layer arranged on the second isolation layer,
the window being formed in the layer stack through the mask layer.

21. The method of manufacturing according to claim 20, wherein the mask layer is a SiN layer.

22. The method of manufacturing according to claim 20, wherein the mask layer is a carbon layer.

23. The method of manufacturing according to claim 20, wherein the mask layer is manufactured using chemical vapor deposition.

24. The method of manufacturing according to claim 20, further comprising:
   removing the mask layer.

25. The method of manufacturing according to claim 20, where removing the mask layer includes removing the mask layer using at least one of:
   a top SiN rapid thermal chemical vapor deposition,
   a fast etching in hydrofluoric ethylene glycol,
   a dummy SiN low pressure chemical vapor deposition,
   a dry etch process, or
   a wet etch process.

* * * * *